(12) United States Patent
Clayton et al.

(10) Patent No.: US 8,692,124 B2
(45) Date of Patent: Apr. 8, 2014

(54) ELECTRICAL CONNECTOR AND METHOD OF MAKING

(75) Inventors: James E. Clayton, Raleigh, NC (US); Zakaryae Fathi, Raleigh, NC (US)

(73) Assignee: Microelectronics Assembly Technologies, Research Triangle Park, NC (US)

( * ) Notice: Subject to any disclaimer, the term of this patent is extended or adjusted under 35 U.S.C. 154(b) by 484 days.

(21) Appl. No.: 12/927,544

(22) Filed: Nov. 17, 2010

(65) Prior Publication Data

US 2011/0069460 A1 Mar. 24, 2011

Related U.S. Application Data

(63) Continuation-in-part of application No. 12/317,754, filed on Dec. 29, 2008, now Pat. No. 8,345,431.

(60) Provisional application No. 61/009,781, filed on Jan. 2, 2008.

(51) Int. Cl.
*H05K 1/00* (2006.01)
(52) U.S. Cl.
USPC ........................................... 174/254

(58) Field of Classification Search
USPC .................. 174/254; 361/749–751
See application file for complete search history.

(56) References Cited

U.S. PATENT DOCUMENTS

| 4,821,007 A * | 4/1989 | Fields et al. ................ 333/238 |
| 6,049,975 A * | 4/2000 | Clayton ........................ 29/832 |
| 2002/0006503 A1* | 1/2002 | Watanabe et al. ............. 428/209 |

\* cited by examiner

*Primary Examiner* — Jeremy C Norris
(74) *Attorney, Agent, or Firm* — Robert J. Lauf (57) ABSTRACT

An electrical connector comprises an elongated flexible circuit having rigid strips bonded onto one or both sides and one or more ends thereof. The strips contain metallized castellations that are aligned with respective metal traces on the flex circuit and soldered thereto. The flexible portion, along with the attached rigid board(s) forms a plug assembly that mates with a socket having contact pins that engage with their respective metallized castellations, with the castellations providing a self-aligning function. The invention may be used to form a flex cable with connectors on one or both ends. Alternatively, the elongated flexible circuit may represent an extension of a larger flex circuit substrate that further contains other electronic devices mounted thereon. The socket and contact pins are preferably attachable to a motherboard by soldering or other means.

20 Claims, 11 Drawing Sheets

ELECTRICAL CONNECTOR AND METHOD OF MAKING

CROSS-REFERENCE TO RELATED APPLICATION

This application is a Continuation in Part of U.S. patent application Ser. No. 12/317,754, entitled "Thin Multi-Chip Flex Module" and filed by the present inventors on Dec. 29, 2008 now U.S. Pat. No. 8,345,431, and which in turn claims the benefit of Provisional Patent Application No. 61/009,781 by the present inventors, filed on Jan. 2, 2008; the entire disclosures of both applications are incorporated herein by reference.

BACKGROUND OF THE INVENTION

1. Field of the Invention

The present invention relates generally to means for connecting microelectronic devices and systems. More particularly, the invention relates to improved flex-circuit based interconnect solutions for electronic circuits.

2. Description of Related Art

The evolution of smaller, lighter electronic devices with ever-increasing functionalities has increased the need for interconnection methods that can handle the flow of large amounts of data between various circuits or modules in a device. Flex circuits are often used to provide a signal routing means that can be easily located in confined places within an equipment enclosure. They are also used to maintain electrical connections between two components that must move relative to one another; examples are the connections between the motherboard and the display on a laptop computer, or in many cell phones.

Various approaches have been used to enable a long, flexible circuit to be reliably connected to a component such as a motherboard. In one case, a socket is permanently installed on the motherboard (typically by soldering). A mating plug is affixed to the end of the flex by mechanically clamping or crimping; this plug contains internal metal pins that pierce the flex to complete an electrical connection between the lines on the flex and the contacts on the plug that will mate with corresponding contacts on the socket. As the number of lines increases, and the pitch becomes correspondingly smaller, both the cost and reliability of this approach can suffer.

Another approach, used particularly when the flex connection might need to withstand especially demanding mechanical forces, is to affix rigid circuit boards on both sides of the flex near the terminations. These boards typically have metal plated through holes and can be placed flat against the motherboard to secure a strong soldered connection. Connectors may also be further strengthened by potting in epoxy.

Another approach, used particularly for the assembly of flex circuits to Liquid Crystal Displays (LCD), is to bond the closely spaced finger contacts disposed at the edge of the flex circuits directly to similarly spaced pads of the glass display using either liquid or film Anisotropic Conductive Adhesives (ACA). Small conductive particles randomly distributed in the ACA material enable electrical contact to be established between the finger contacts of the flex circuit and the pads of the LCD display through the vertical (Z-axis) direction but not laterally between adjacent pads do to their small size and low particle loading (typically 5-8% by volume) within the adhesive. These bonds are intended to be permanent and are therefore not easily removed.

OBJECTS AND ADVANTAGES

Objects of the present invention include at least the following: providing a flex interconnect system having improved mechanical strength; providing a low-cost, highly reliable flex interconnect system; providing a more reliable and manufacturable flex interconnect suitable for higher line densities and finer pitches; providing improved flex connectors that are easily connected and disconnected; and, providing a method for manufacturing flex connectors that is cost effective and suitable for high pin counts.

SUMMARY OF THE INVENTION

In accordance with one aspect of the invention, a flexible electrical connector comprises: a circuit having a generally elongated flexible portion with a plurality of conductive lines on at least one surface thereof, the lines extending to at least one termination thereof; at least one rigid circuit strip bonded to the flexible circuit at the termination, the rigid circuit strip having thereon a plurality of metallized castellations respectively aligned with the plurality of conductive lines; and, a conductive bond connecting each of the conductive lines on the flexible portion with its respective metallized castellation.

In accordance with another aspect of the invention, a flexible electrical connector comprises: a circuit having a generally elongated flexible portion with a plurality of conductive lines on at least one surface thereof, the lines extending to at least one termination thereof; at least one rigid circuit strip bonded to the flexible circuit at the termination, the circuit strip having thereon a plurality of metallized castellations respectively aligned with the plurality of conductive lines; a conductive bond connecting each of the conductive lines on the flexible portion with its respective metallized castellation; and, an interconnect comprising a mechanical socket securely engaging the rigid circuit strip and a plurality of electrical contact pins engaging their respective metallized castellations.

In accordance with another aspect of the invention, a method for making an electrical connector comprises the steps of:

forming a circuit having a generally elongated flexible portion with a plurality of conductive lines on at least one surface thereof, the lines extending to at least one termination thereof;

forming at least one rigid circuit strip having thereon a plurality of metallized castellations respectively alignable with the plurality of conductive lines;

aligning the castellations on the rigid circuit strip with the conductive lines;

bonding the rigid circuit strip to the flexible circuit at the termination thereof; and, forming a conductive bond connecting each of the conductive lines on the flexible portion with its respective metallized castellation.

In accordance with another aspect of the invention, a method for simultaneously making two electrical connectors comprises the steps of:

forming a circuit having a generally elongated flexible portion with a plurality of conductive lines on at least one surface thereof;

forming at least one rigid circuit strip;

bonding the rigid circuit strip to the flexible circuit at a selected position along its length;

forming metal plated through holes electrically connecting the respective conductive lines on the flexible portion with the rigid circuit strip; and, sectioning the flexible circuit and rigid circuit strip through the centers of the metal plated through holes to form two electrical connectors with a plurality of metallized castellations on one edge.

DETAILED DESCRIPTION OF THE INVENTION

The present invention addresses the design of effective interconnect solutions for flex circuits, with the objectives of creating a reliable termination to an elongated flex, particularly when high pin counts and/or fine line pitches make mechanically crimped connections less desirable. It is based on Applicants' recognition that a rigid module having metallized castellations can be designed to reliably self-align into a mechanical connector, as taught in Applicants' aforementioned co-pending U.S. patent application Ser. No. 12/317,754 as well as in Applicants' U.S. Pat. No. 7,796,399.

Figure 1:
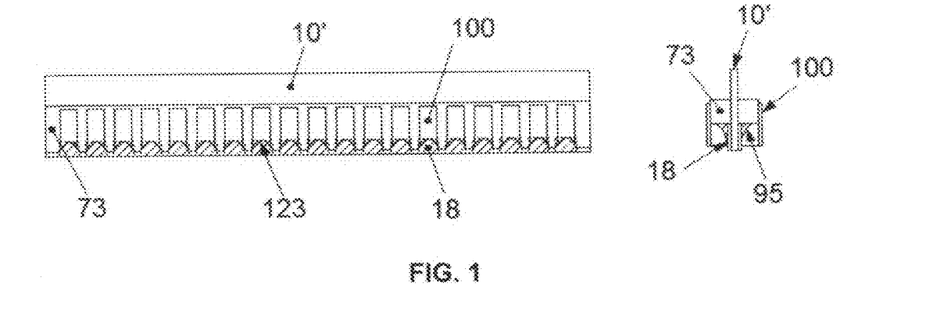
FIG. 1 illustrates schematically two rigid circuit strips having castellations on the external contact pads bonded to a flexible circuit according to one aspect of the invention.
Figure 2A:
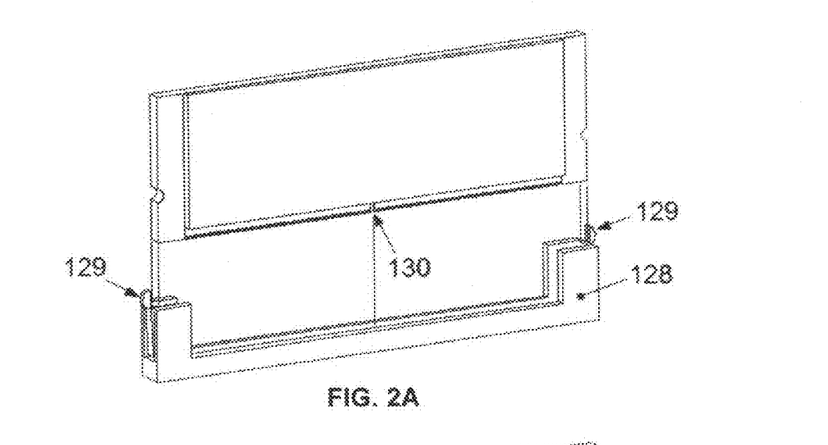
FIG. 2 illustrates schematically a low-profile pin contact arrangement suitable for use with castellated contact pads according to another aspect of the invention.
Figure 2B:
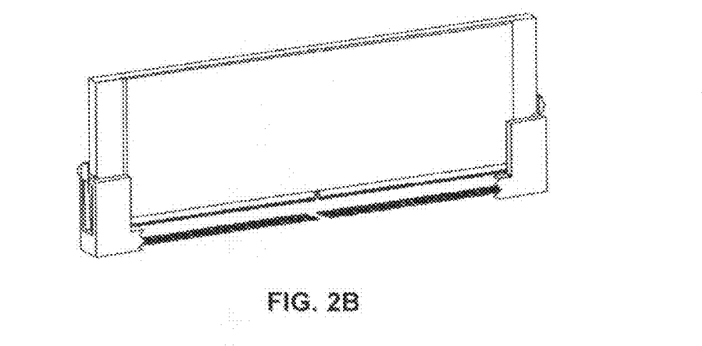
Figure 3A:
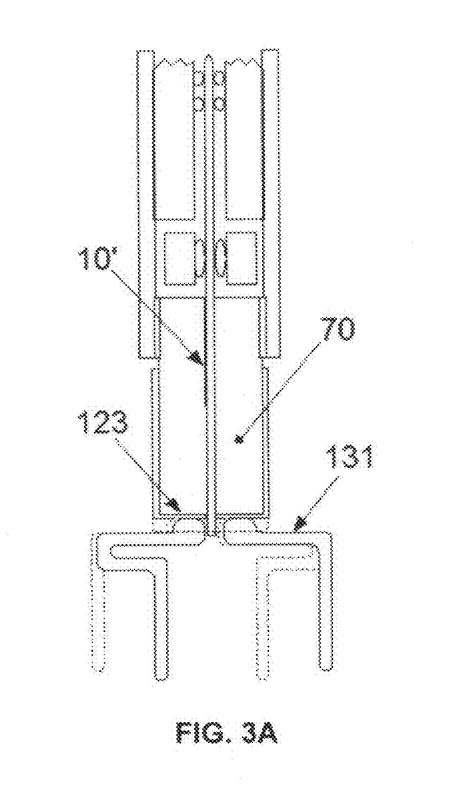
FIG. 3 illustrates the self-aligning properties of a castellated connector system according to another aspect of the invention.
Figure 3B:
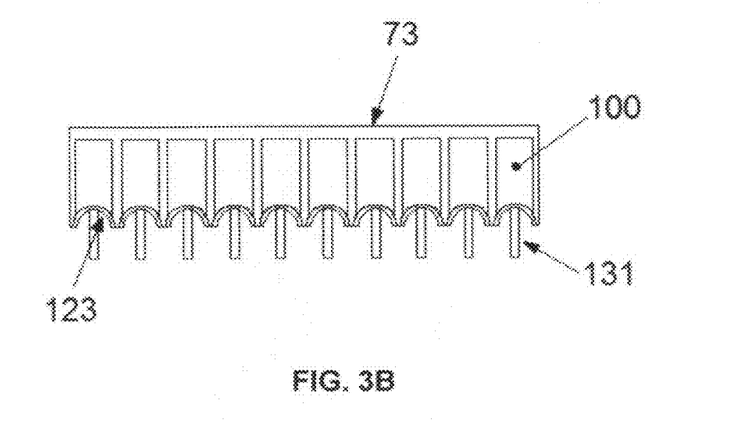

FIGS. 1-3 illustrate an electronic module in which a central flex substrate 10' is either flush or extends only a short distance beyond the lower edges of hollowed PWB frames 73 containing DIMM-type copper clad contact pads 100. The extreme bottom edges of the hollowed frames contain an array of metallized castellations 123 (crescent shaped copper plated through holes) that electrically bridge across the thickness of the frames and enable the exterior PWB contact pads 100 to be electrically connected with interior pads 18 arrayed on the either side of the interconnecting substrate 10'. The metallized castellations are electrically connected to the pads of the interconnecting substrate using either solder 95 or electro-plated connections, FIG. 1.

FIGS. 2A and 2B illustrate how the resulting rigid electronic module is inserted into a mating socket 128 with optional latching mechanism 129 and centering slot 130.

FIGS. 3A and 3B provide two views showing how a castellated structure 123 on the bottom of rigid frame 73 provides a self-aligning function to guide contact pins 131 into place when the module is inserted into a socket. The interconnecting substrate 10', as shown in FIG. 3A, extends a short distance beyond the lower edge of metallized castellations 123 to electrically isolate contacts pins 131 on either side of the substrate.

Applicants' co-pending patent application is generally directed to the interconnection of a substantially rigid circuit module (particularly a DIMM module) to a motherboard by plugging it into a DIMM-type mating socket or by attaching it directly to a motherboard. The present invention is based on Applicants' recognition that a castellated connector also offers significant improvements for the general problem of flexible interconnect systems, as will be described in detail in examples that follow. Other examples will show that the invention is amenable to low-cost manufacturing using familiar methods in the art of electronics production.

Extensive background information on the general art of modern flexible circuit design and manufacturing may be found in *Flexible Circuit Technology*, Third Edition, by Joseph Fjelstad, the entire contents of which are incorporated herein by reference.

Example

Figure 4A:
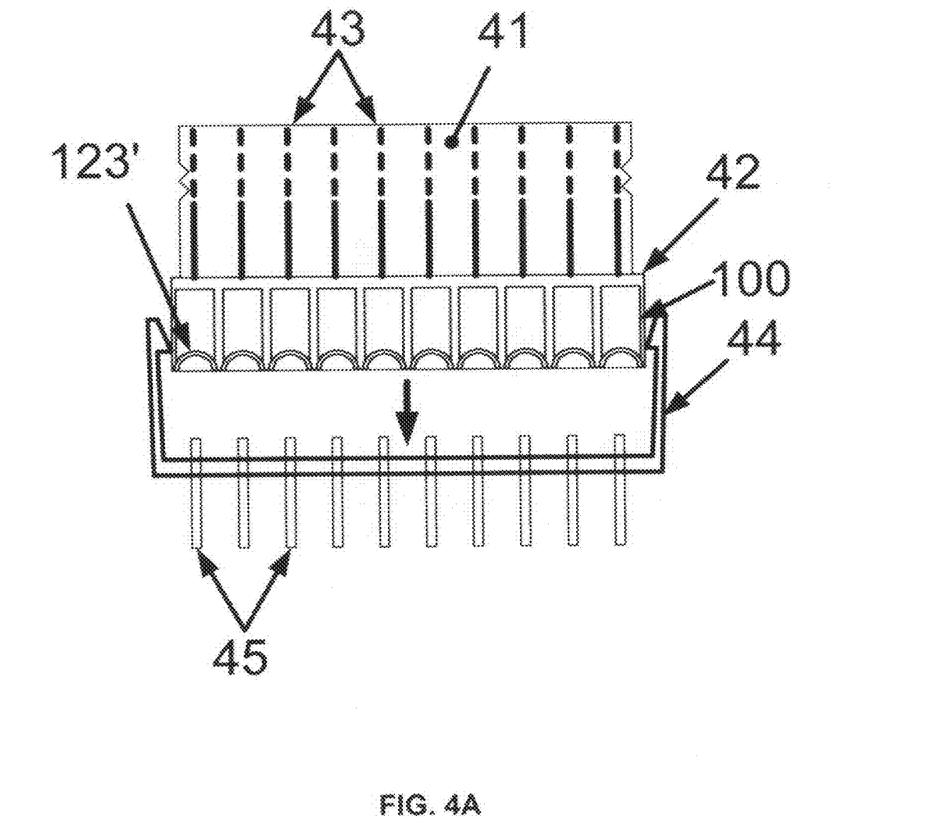
FIG. 4 illustrates a flexible electrical connector comprising rigid strips having metallized castellations, and a compatible connector according to another aspect of the invention.
Figure 4B:
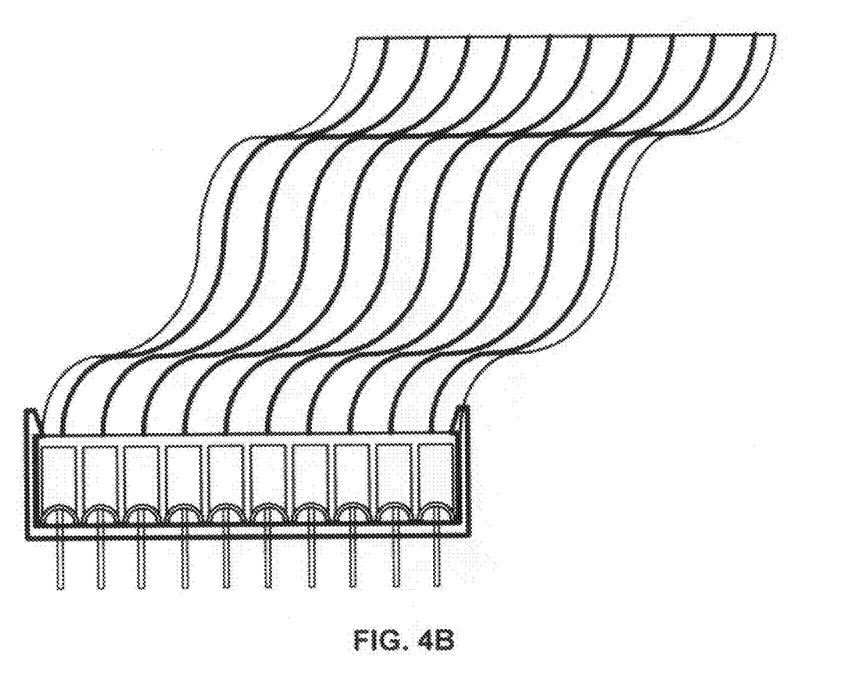

FIG. 4A shows a flexible dielectric sheet 41 with conductive lines 43 thereon. A rigid strip 42, slightly longer than the width of flexible sheet 41, is joined to the end of the flex, preferably by adhesive bonding. Strip 42 has metallized castellations 123' along the edge, each of which is aligned with a respective line 43 on the flex. A socket 44, which is preferably injection molded plastic, has a conventional internal guide slot and a simple snap latch to hold the strip securely in place as shown generally in FIG. 4B Contact pins or blades 45 engage respective metallized castellations 123'. The pins 45 may be configured to be attached to a motherboard using plated through-holes, soldered vias, surface mount pads, etc., as are known in the art. In this way, the socket 44 may be mounted permanently or semi-permanently to the motherboard, whereas the flex cable may be plugged and unplugged as needed. If the rigid strip 42 includes DIMM-type copper clad contact pads 100, as shown in FIGS. 4A and 4B, then the flex cable can be plugged and unplugged into standard DIMM-type sockets as well.

Example

Figure 5:
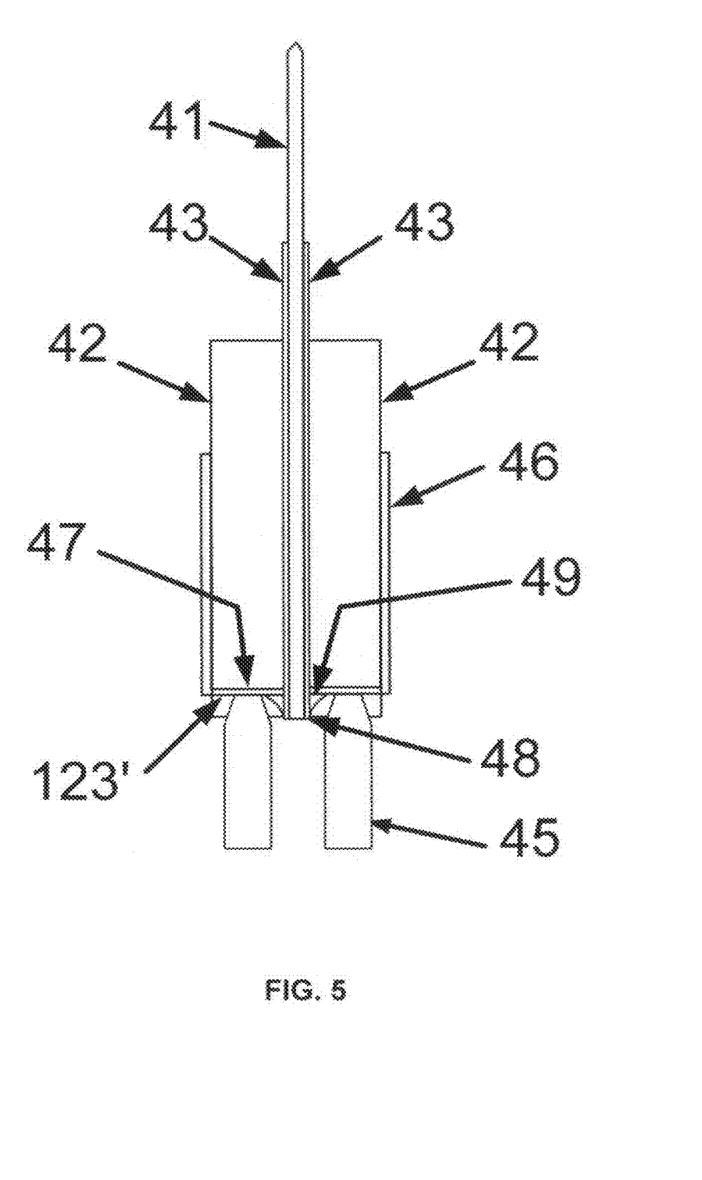
FIG. 5 illustrates a flexible connector system according to another aspect of the invention.

A detailed cross-sectional view of a flex connector is shown in FIG. 5. In this case, metal traces 43 are located on both sides of flex 41 (Applicants contemplate that in some applications, a single-sided arrangement may be used.) Rigid strips 42 are preferably made from conventional PCB laminate material and preferably bonded or laminated to flex 41 using adhesive. In addition to the metallized castellations 123', external contact pads 46, which are electrically connected to the plated inner surface 47 of castellations 123', may be provided. External contacts 46 may be configured to make the connector compatible with conventional edge-card connectors or alternatively, contact pads 46 may consist of simple annular rings as are commonly associated with PWB plated through holes. The bottom edge 48 of flex 41 extends to (or just past) the castellated edge of strips 42. Because the flexible dielectric material is not wetted by solder, the solder fillets 49 that connect traces 43 to castellations 123' can be formed by passing the castellated edge over a conventional solder wave fountain or solder pot, thereby simplifying manufacturing.

Example

Figure 8:
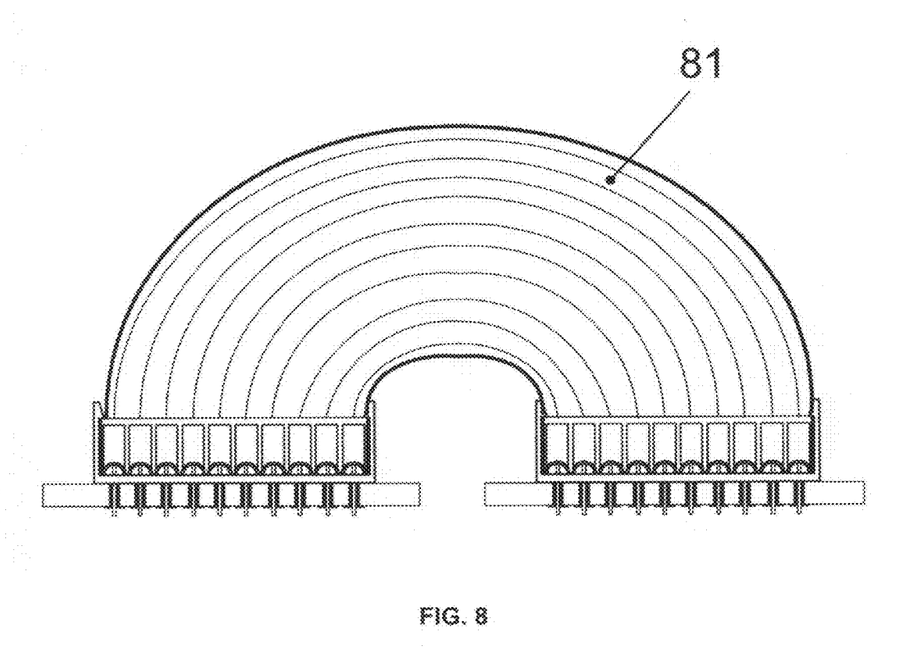
FIG. 8 illustrates a flex cable with connectors on both ends according to one aspect of the invention

FIG. 5 shows the inventive connector on one end of a flexible cable. It will be appreciated that the other end may have an identical connector, thereby forming a simple flex cable 81 as shown schematically in FIG. 8. However, the invention may be readily modified in various ways to create other useful interconnection architectures as described in the following examples.

Example

Figure 6:
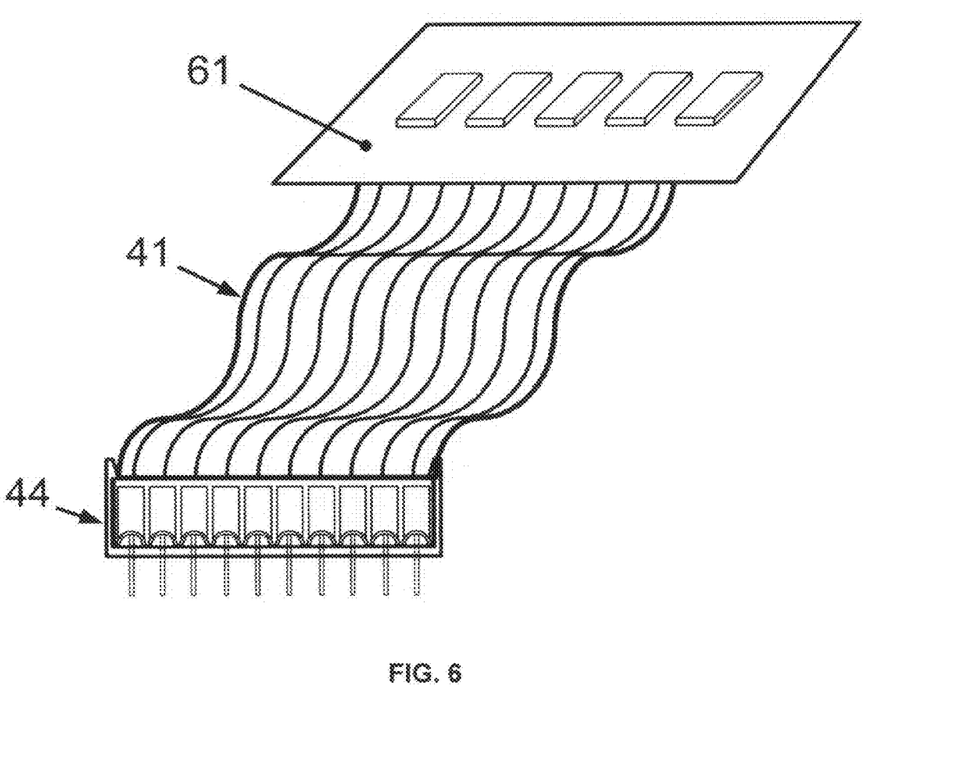
FIG. 6 illustrates a flex connector adapted to add a flexible interconnect to a printed circuit board or card according to another aspect of the invention.

FIG. 6 illustrates a printed circuit board or card 61 having various microelectronic devices thereon. It will be understood that the individual devices on board 61 may be of any type, such as memory, logic, transducer, display, optoelectronic, or passive devices. Furthermore, the devices may be of any style compatible with the substrate, such as surface mount, bare die, packaged die, multichip module, etc. One end of flex 41 is permanently attached to circuit board 61 by any conventional means. The other end (configured generally as shown in FIG. 4) allows board 61 to be plugged into socket 44, which is typically mounted on a motherboard.

Example

Figure 7:
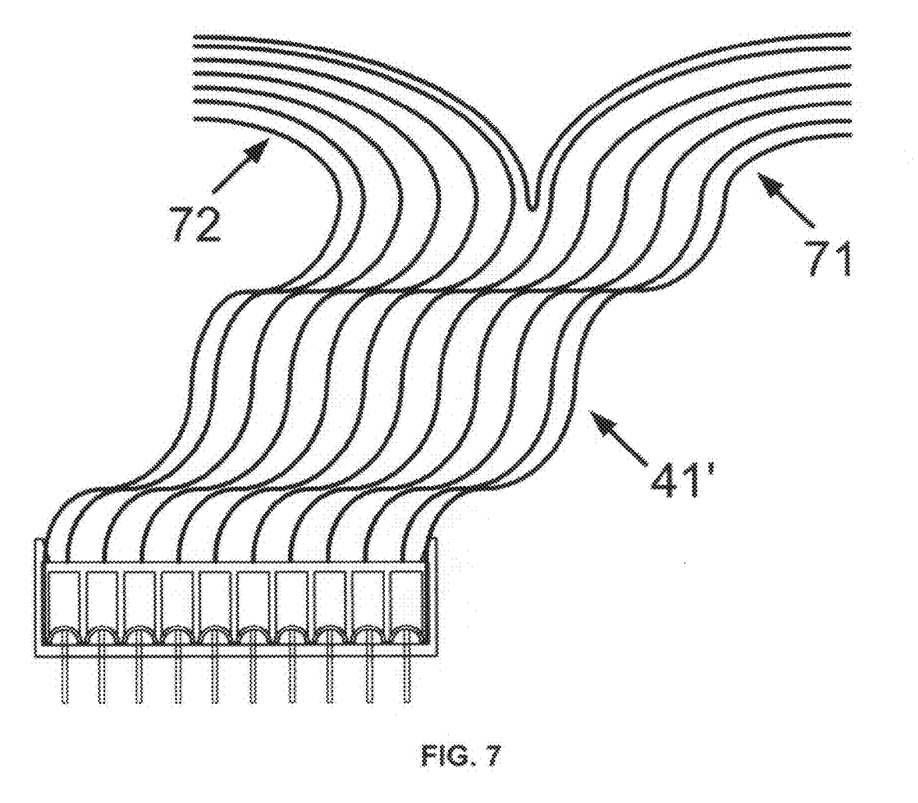
FIG. 7 illustrates a split flex cable with a connector on one end according to another aspect of the invention.

FIG. 7 illustrates another possible modification, in which the flex cable 41' is split into two branches 71 and 72. The individual branches 71 and 72 may have end terminations like those shown in FIGS. 4 and 5, or they may be connected directly to other devices or boards as shown in FIG. 6.

Example

Figure 9:
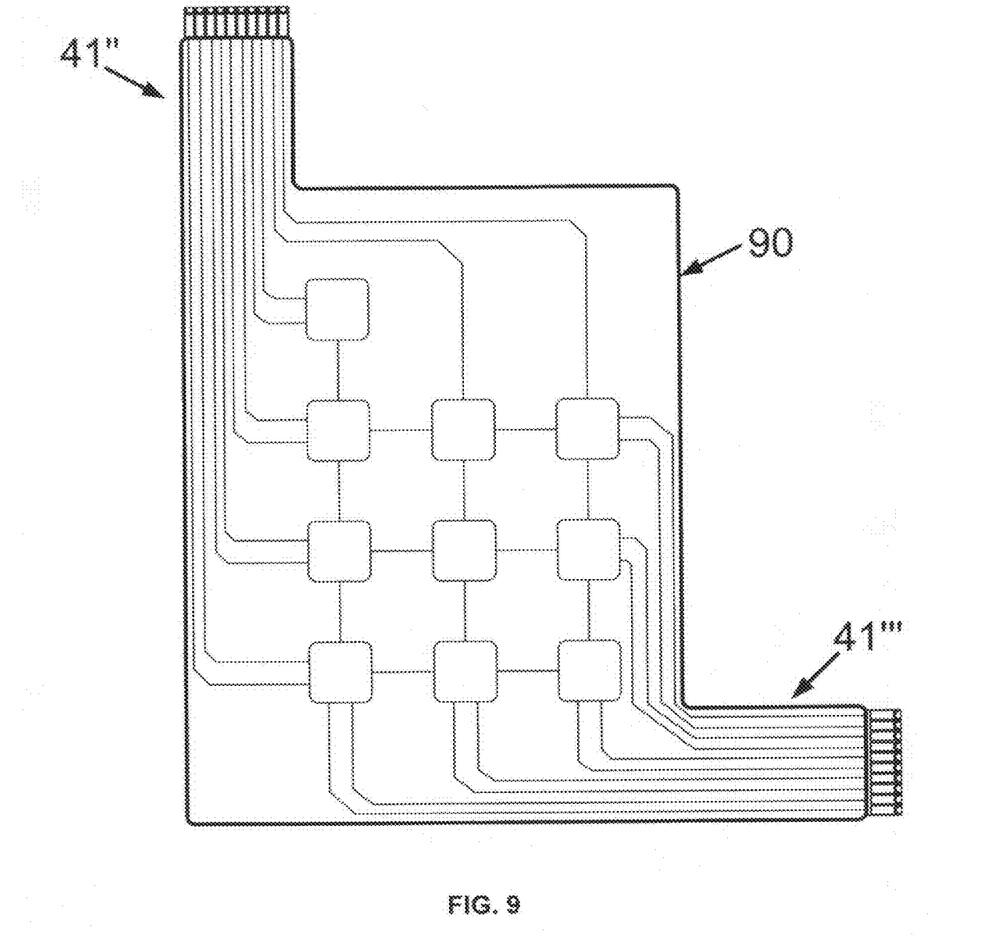
FIG. 9 illustrates a circuit board made from a single flexible dielectric sheet having two extensions to connect to other devices according to another aspect of the invention.

FIG. 9 illustrates another modification of the invention, in which a sheet of flexible dielectric 90, having various microelectronic devices and circuits thereon, also has one or more extensions 41" and 41'", which terminate in connections of the type described in the preceding examples. Thus, the invention provides a versatile interconnection architecture that is not limited to any particular geometry. Furthermore, it will be understood that the invention encompasses ribbon cables in addition to flexible circuits.

Example

Figure 10:
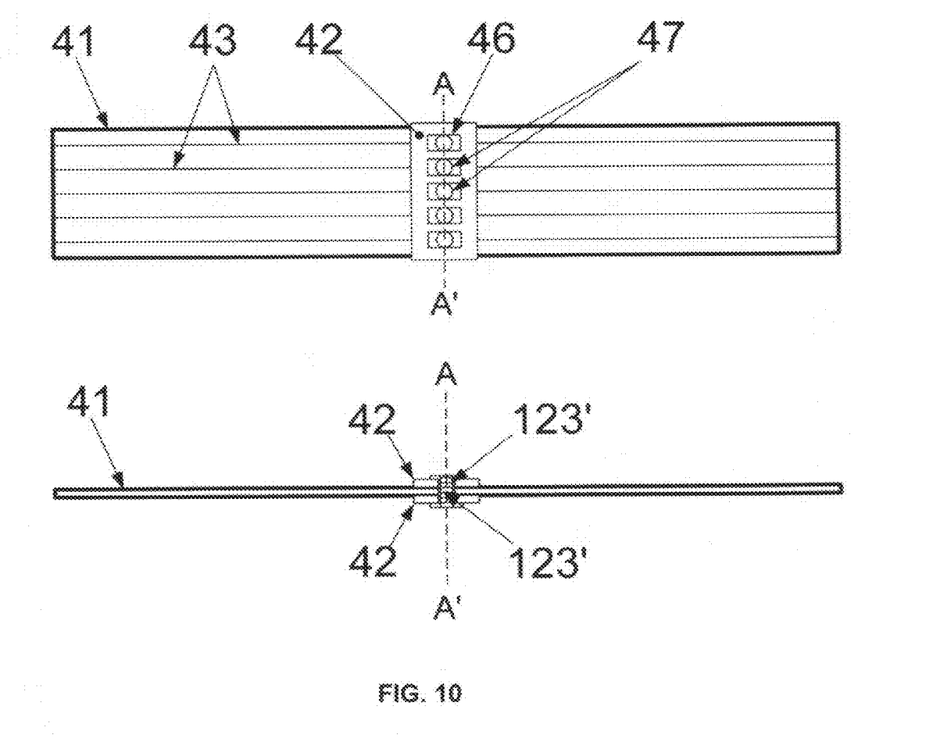
FIG. 10 illustrates two rigid circuit strips bonded to a flexible circuit with a row of plated through holes that are segmented (cut) through the middle of the through holes to yield two separate connectors having castellations on the external contact pads.

FIG. 10 illustrates one method for manufacturing the invention, in which one or two rigid strips 42 are bonded to one or both surfaces of the flex 41 near the middle of a length of the flex. The rigid strips and flex circuit include rectangular pads 46 or simple annular rings (not shown) in which through holes 47 are drilled and then plated. These through holes electrically connect with traces 43 of the flex when the walls of the holes are plated. After plating, two individual cables are simultaneously produced when a thin saw blade or laser is used to cut through the thickness of the stack-up along a line A-A' which bisects the plated through holes. It will be noted, however, that the flex will be flush with the walls of the metalized castellations using this manufacturing method and that the plated metal will electrically bridge the thickness of the connector. Although a single segment of flex 41 is shown in FIG. 10, it will be appreciated that this method may readily be adapted to continuous, semi-continuous, or reel-to-reel type processing as well. In that case, a semi-infinite length of flex 41 may be dispensed from a reel, the connector(s) would be added, and then the strip would be indexed to the next termination point. Thus, connectors of any desired length may be made easily on one assembly line, simply by changing the spacing of the rigid strips 42 along the flex 41 as it is dispensed.

Example

Figure 11:
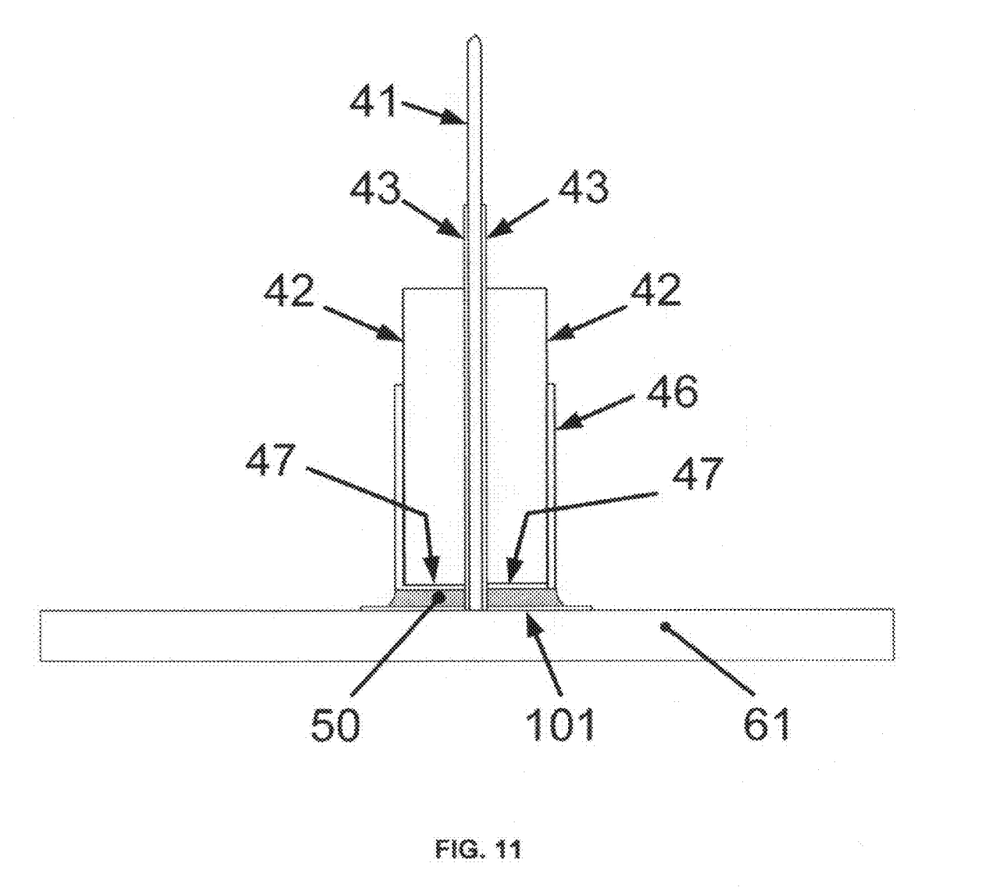
FIG. 11 is a cross-sectional view illustrating a flex cable directly connected to a motherboard using a vertical butt-soldered configuration.

FIG. 11 illustrates a mounting method of the invention in which the connector is directly attached to a printed circuit board 61. As described previously, the bottom end of the connector cable can be dipped into a solder bath to form a solder fillets 49 that electrically bridge the walls 47 of the plated through holes to pads 18 disposed at the termination of flex 41. Depending on the amount of solder present, these solder fillets may then advantageously be used to solder 50 the bottom edge of the connector directly to surface pads 101 disposed on the PWB 61. If additional solder is required to make a reliable joint, it may be stenciled in place onto the surface of the PWB prior to placing the cable connector onto the surface of the PWB. To position and hold the connector during the soldering process, posts would be included at the ends of the connector (not shown) that would engage holes in the PWB to hold the connector at a desired angle and in alignment with pads disposed on the PWB. If a vertical angle is used, as illustrated, then independent solder connections can be made to both sides of flex, if the flex extends in a manner to act as an insulator between the opposing sides of the flex.

In the various illustrations, the flexible cable 41 is shown as a fairly pronounced extension or as a fairly long cable. It will be appreciated, however, that the invention is not limited to long structures per se. The flex must be elongated beyond the actual connector at least to a sufficient length to provide the needed freedom of movement (such as a 90 or 180° bend) for which a flexible connection is desired in the first place. Applicants contemplate that in general the elongation will be at least 2-3 times the height of the rigid strip 42.

Example

The inventive connector is preferably manufactured as follows. A flex circuit having conductive traces and optional termination pads extending to one edge (on at least one surface of the flex) is formed by conventional means. Castellations (partial remnants of plated through holes) are formed along one edge of a strip of rigid dielectric such as FR4 or other PWB material; the castellations are spaced apart so that they can be aligned with the respective conductive traces on the flex. The strip is preferably (but not necessarily) slightly longer than the width of the flex to facilitate latching into the socket. The strip is aligned with the traces on the flex and bonded thereto, preferably by a polymer-based adhesive. If a two-sided flex is used, then a second strip is affixed to the opposite surface of the flex. After bonding, the end of the flex extends at least out to the edges of the castellations, so that the exposed edge of the flex dielectric serves as a solder dam to prevent solder bridging between respective castellations on opposite sides of the connector. The bonded assembly is then passed over a solder wave or solder pot so that solder fillets are formed under each castellation, forming a secure electrical connection between the castellations and their respective traces or termination pads on the flex.

Although Applicants contemplate that for many applications, adhesive bonding is preferred, it will be appreciated that mechanical clamping, various press-fit features, etc., may be designed into the strips to provide a secure physical bond before soldering.

We claim:

1. A flexible electrical connector comprising:
   a circuit having a generally elongated flexible portion with a plurality of conductive lines on at least one surface thereof, said lines extending to at least one termination thereof;
   at least one rigid circuit strip bonded to said at least one surface of said flexible circuit at said at least one termination, leaving a sufficient length of said flexible portion extending behind said rigid strip so that said rigid strip is free to move relative to another portion of said flexible circuit to form a flexible connection, said rigid circuit strip having thereon a plurality of metallized castellations respectively aligned with said plurality of conductive lines;
   wherein said castellations lie on the opposite edge of said rigid circuit strip from said extended flexible portion so that said castellations are matable to respective contacts on an external interconnection system; and,
   a conductive bond connecting each of said conductive lines on said flexible portion with its respective metallized castellation.

2. The electrical connector of claim 1 wherein said elongated flexible portion has conductive lines on both surfaces thereof, and rigid circuit strips are bonded to each surface respectively.

3. The electrical connector of claim 1 wherein said flexible elongated portion comprises a flex cable, wherein said conductive lines run from one end to the other and each end has at least one rigid circuit strip bonded thereto.

4. The electrical connector of claim 1 wherein said flexible elongated portion comprises an extension of a larger flexible circuit board, said flexible circuit board further having at least one electronic device mounted thereon.

5. The electrical connector of claim 1 wherein said external interconnection system comprises a mechanical socket and a plurality of electrical contact pins engaging their respective metallized castellations.

6. The electrical connector of claim 5 wherein said mechanical socket further comprises a releasable latching mechanism.

7. The electrical connector of claim 1 further comprising an adhesive bond between said flexible portion and said rigid strip.

8. The electrical connector of claim 1 wherein said external interconnection system comprises an array of electrical contact pads on a PWB so that using a butt-solder connection may be used to join said plurality of metallized castellations to said respective electrical contact pads of said PWB.

9. A flexible electrical connector comprising:
   a circuit having a generally elongated flexible portion with a plurality of conductive lines on at least one surface thereof, said lines extending to at least one termination thereof;
   at least one rigid circuit strip bonded to said flexible circuit at said at least one termination, leaving a sufficient length of said flexible portion extending behind said rigid strip so that said rigid strip is free to move relative to another portion of said flexible circuit to form a flexible connection, said rigid circuit strip having thereon a plurality of metallized castellations respectively aligned with said plurality of conductive lines;
   a conductive bond connecting each of said conductive lines on said flexible portion with its respective metallized castellation; and,
   an interconnect comprising a mechanical socket securely engaging said rigid circuit strip and a plurality of electrical contact pins engaging their respective metallized castellations.

10. The electrical connector of claim 9 wherein said mechanical socket and said electrical contact pins form a socket assembly, and said assembly is attachable to a motherboard.

11. The electrical connector of claim 9 wherein said mechanical socket is mechanically attachable to a motherboard and said electrical contact pins are solderable to said motherboard.

12. A method for making an electrical connector comprising the steps of:
    forming a circuit having a generally elongated flexible portion with a plurality of conductive lines on at least one surface thereof, said lines extending to at least one termination thereof;
    forming at least one rigid circuit strip having thereon a plurality of metallized castellations respectively alignable with said plurality of conductive lines;
    aligning said castellations on said at least one rigid circuit strip with said conductive lines;
    bonding said at least one rigid circuit strip to said at least one surface of said flexible circuit at said at least one termination thereof leaving a sufficient length of said flexible portion extending behind said rigid strip so that said rigid strip is free to move relative to another portion of said flexible circuit to form a flexible connection and wherein said castellations lie on the opposite edge of said riqid circuit strip from said extended flexible portion so that said castellations are matable to respective contacts on an external interconnection system; and,
    forming a conductive bond connecting each of said conductive lines on said flexible portion with its respective metallized castellation.

13. The method of claim 12 wherein said elongated flexible portion has conductive lines on both surfaces thereof, and rigid circuit strips are bonded to each surface respectively.

14. The method of claim 12 wherein said flexible elongated portion comprises a flex cable, wherein said conductive lines run from one end to the other and each end has at least one rigid circuit strip bonded thereto.

15. The method of claim 12 wherein said flexible elongated portion comprises an extension of a larger flexible circuit board, said flexible circuit board further having at least one electronic device mounted thereon.

16. The method of claim 12 wherein said external interconnection system comprises a mechanical socket and a plurality of electrical contact pins engaging their respective metallized castellations.

17. The method of claim 16 wherein said mechanical socket further comprises a releasable latching mechanism.

18. The method of claim 12 further comprising an adhesive bond between said flexible portion and said rigid strip.

19. A method for making an electrical connector comprising the steps of:
    forming a circuit having a generally elongated flexible portion with a plurality of conductive lines on at least one surface thereof;
    forming at least one rigid circuit strip;
    bonding said rigid circuit strip to said flexible circuit at a selected point along its length;
    forming metal plated through holes electrically connecting respective conductive lines on said flexible portion with said rigid circuit strip; and, sectioning said flexible circuit and said rigid circuit strip through the centers of said metal plated through holes to form two electrical connectors, each with a plurality of metallized castellations on one edge leaving a sufficient length of said flexible portion extending behind each of said rigid strips so that each of said rigid strips is free to move relative to another portion of its respective flexible circuit to form a flexible connection.

20. The method of claim 19 wherein said flexible circuit is dispensed from a reel and said rigid circuit strips are bonded to said flexible circuit at selected locations along its length, so that after sectioning, flexible connector strips of selected lengths are obtained.

* * * * *